United States Patent
Kaiser et al.

(10) Patent No.: US 9,310,949 B2
(45) Date of Patent: Apr. 12, 2016

(54) TOUCH-SENSITIVE OPERATING DEVICE FOR A MOTOR VEHICLE AND MOTOR VEHICLE

(71) Applicant: VALEO Schalter und Sensoren GmbH, Bietigheim-Bissingen (DE)

(72) Inventors: Frank Kaiser, Grossbottwar (DE); Sascha Staude, Ludwigsburg (DE); Stefan Mueller, Boxberg (DE)

(73) Assignee: VALEO Schalter und Sensoren GmbH, Bietigheim-Bissingen (DE)

( * ) Notice: Subject to any disclaimer, the term of this patent is extended or adjusted under 35 U.S.C. 154(b) by 0 days.

(21) Appl. No.: 14/368,137

(22) PCT Filed: Dec. 20, 2012

(86) PCT No.: PCT/EP2012/076349
§ 371 (c)(1),
(2) Date: Jun. 23, 2014

(87) PCT Pub. No.: WO2013/092838
PCT Pub. Date: Jun. 27, 2013

(65) Prior Publication Data
US 2014/0375584 A1 Dec. 25, 2014

(30) Foreign Application Priority Data

Dec. 24, 2011 (DE) .......... 10 2011 122 399
Mar. 6, 2012 (DE) .......... 10 2012 004 636

(51) Int. Cl.
*B60Q 1/14* (2006.01)
*G06F 3/044* (2006.01)
*G06F 3/01* (2006.01)

(52) U.S. Cl.
CPC .............. *G06F 3/044* (2013.01); *B60Q 1/1476* (2013.01); *G06F 3/017* (2013.01); *B60K 2350/1012* (2013.01); *B60K 2350/1024* (2013.01); *B60K 2350/407* (2013.01); *B60K 2350/928* (2013.01); *G06F 2203/04104* (2013.01); *G06F 2203/04108* (2013.01)

(58) Field of Classification Search
CPC .......... G06F 3/107; G06F 2203/04014; G06F 2203/04108; G06F 3/017; G06F 3/044; B60K 2350/407; B60K 2350/928; B60K 2350/1012; B60K 2350/1024; B60Q 1/1469; B60Q 1/1476; G05G 9/00–9/02
USPC .......................... 200/61.28–61.38, 335, 553
See application file for complete search history.

(56) References Cited

U.S. PATENT DOCUMENTS

| | | | |
|---|---|---|---|
| 2006/0047386 A1* | 3/2006 | Kanevsky et al. | 701/36 |
| 2008/0122799 A1* | 5/2008 | Pryor | 345/173 |
| 2010/0188343 A1* | 7/2010 | Bach | 345/173 |
| 2012/0072072 A1* | 3/2012 | Backman | 701/36 |

FOREIGN PATENT DOCUMENTS

| | | | | |
|---|---|---|---|---|
| DE | 103 31 776 B3 | | 5/2005 | |
| DE | 10 2009 022 471 A1 | | 12/2010 | |
| FR | 2 880 145 A1 | | 6/2006 | |
| FR | 2880145 A1 | * | 6/2006 | ............... G05G 9/00 |
| WO | 2008/131190 A1 | | 10/2008 | |

OTHER PUBLICATIONS

International Search Report issued in PCT/EP2012/076349 mailed on Apr. 4, 2013 (4 pages).

* cited by examiner

*Primary Examiner* — Larry Sternbane
(74) *Attorney, Agent, or Firm* — Osha Liang LLP

(57) ABSTRACT

The invention relates to a touch-sensitive operating device (1) for a motor vehicle, having an actuation lever (2), in particular a steering column stalk, which has an elongate configuration, having a sensor arrangement comprising at least one touch-sensitive and/or proximity-sensitive sensor element (4) which is arranged on the actuation lever (2), and having an electronic evaluation device which is coupled to the at least one sensor element (4) and is configured to detect the at least one sensor element (4) being touched and/or the at least one sensor element (4) being approached. The evaluation device is configured to identify an operating gesture of an operator on the actuation lever on the basis of a combination of at least two detected touches on the sensor arrangement and/or approaches towards the sensor arrangement, and to trigger a predetermined operating function on the basis of the identified operating gesture.

16 Claims, 1 Drawing Sheet

TOUCH-SENSITIVE OPERATING DEVICE FOR A MOTOR VEHICLE AND MOTOR VEHICLE

The invention relates to a touch-sensitive operating device for a motor vehicle, having an actuating lever, in particular a steering column stalk, which has an elongate configuration, and having a multiplicity of touch-sensitive and/or proximity-sensitive sensor elements which are arranged on the actuation lever, and also having an electronic evaluation device which is coupled to the sensor elements and is configured to detect the individual sensor elements being touched and/or the individual sensor elements being approached. The invention also relates to a motor vehicle having such an operating device.

In the present case, the interest is directed in particular to a capacitive operating device which has a multiplicity of capacitive sensor electrodes which form capacitor plates of respective actuation capacitors. The respective second capacitor plate is formed by the finger of the user. Thus, the capacitance of the actuation capacitor changes when the sensor electrode is touched or approached, which can be detected by means of an electronic evaluation device. Capacitive operating devices of this type are already prior art. Thus, for example, document DE 10 2009 022 471 A1 describes a steering column switch with a switching lever on which a plurality of capacitive sensor electrodes are mounted. A wide variety of switching processes can be motionlessly detected via the capacitive detection of the finger position by means of the capacitive sensor electrodes.

It is the object of the invention to demonstrate a solution as to how the functionality of an operating device of the generic type mentioned at the outset can be extended in comparison with the prior art.

This object is achieved according to the invention by means of an operating device and by means of a motor vehicle having the features according to the respective independent patent claims. Advantageous embodiments of the invention are the subject matter of the dependent patent claims, the description and the figures.

A touch-sensitive and/or proximity-sensitive operating device according to the invention for a motor vehicle has an actuation lever, in particular a steering column stalk, which has an elongate configuration. Said operating device also comprises a sensor arrangement comprising at least one touch-sensitive and/or proximity-sensitive sensor element which is arranged on the actuation lever. The operating device also comprises an electronic evaluation device which is coupled to the at least one sensor element and is configured to detect the at least one sensor element being touched and/or the at least one sensor element being approached. According to the invention, provision can be made for the evaluation device to identify an operating gesture of an operator on the actuation lever on the basis of a combination of at least two detected touches on the sensor arrangement and/or approaches towards the sensor arrangement, and to trigger a predetermined operating function on the basis of the identified operating gesture.

Unlike in the subject matter according to document DE 10 2009 022 471 A1—that document concerns merely the identification of the position of a finger solely on the basis of a single touch—it is therefore proposed according to the invention to detect the operating gesture of the operator on the basis of a combination of at least two touches on the sensor arrangement and/or approaches towards the sensor arrangement. Therefore, in order to identify the operating gesture, at least two measurements are performed at the sensor arrangement and evaluated in respect of the operating gesture of the operator. On the one hand, these can be two temporally offset measurements at a single sensor element or a plurality of sensor elements or, on the other hand, two—optionally also simultaneous—measurements at a plurality of different sensor elements. As a result, the functionality or the area of application of the operating device is thus expanded in comparison with the prior art such that the respective operating gesture can be detected with high precision on the basis of the evaluation of such a combination of at least two touches of the sensor arrangement and/or approaches towards the sensor arrangement, and the operating intentions of the operator on the actuation lever can even be detected in advance. In addition, a multiplicity of operating gestures can therefore be defined, it being possible for in each case a different operating function to be associated with each operating gesture. Consequently, an entire sequence of operating functions can be triggered with only a single actuation lever, in particular steering column stalk, which operating functions could otherwise only be provided with the aid of multiple actuation levers such as this.

In the present case, an operating gesture is understood to be the manner in which the operator—in particular the driver—grasps the actuation lever. Said grasping can mean a specific touch or a specific feel of the actuation lever with one or more fingers.

It proves to be particularly advantageous when the actuation lever—for example, steering column stalk—is mechanically operable in at least two manners. This means that, in addition to the touch-sensitive operation, a mechanical actuation of the actuation lever is also possible, whether that is a movement of the actuation lever or whether that is merely applying a force to the actuation lever and subsequent detection by means of a force sensor. By way of example, the actuation lever is mounted so as to be pivotable in a horizontal direction—along the vehicle yaw axis—and/or in the vertical direction—along the vehicle longitudinal axis. However, the actuation lever can also be pushed along its own longitudinal axis. It can also have a mechanical operating element which can be moved, in particular, for example, can be pushed and/or rotated and/or pivoted, relative to a main body of the actuation lever. In this embodiment, the evaluation device can be configured to determine in advance, on the basis of the detected operating gesture, the manner of a forthcoming or intended mechanical operation of the actuation lever. This means that the evaluation device can predict or determine in advance, on the basis of the touch and/or approach, in which manner the user intends to mechanically operate the actuation lever. In this connection, it is possible to differentiate, for example, between the following manners of the mechanical operation:

- a horizontal movement of the actuation lever, namely a pivoting movement about the vehicle yaw axis, and/or
- a vertical movement of the actuation lever, namely a pivoting movement about the vehicle longitudinal axis, and/or
- the actuation of a switch and/or a button on the actuation lever, and/or
- the actuation of a rotary switch, namely in particular about a longitudinal axis of the actuation lever which has an elongate configuration.

By way of example, this may have the appearance that a simultaneous touch on three different sensor elements signals the intention of a rotational movement of a rotary switch, while the temporally offset touch on two sensor elements signals the intention of a push movement of the actuation lever. On the basis of the detected intention of the user, a wide variety of actions can then be triggered or a wide variety of processes can then be effected in the motor vehicle.

By way of example, the following embodiments can be provided: the identification of an intended actuation of an indicator can activate a blind-spot monitoring device, for example. By contrast, said blind-spot monitoring device does not need to be activated after identification of an intended activation of the main beam/headlight flasher. According to another example, the identification of the intention to change the sensitivity of a rain sensor or an interval speed of a windscreen wiper on a wiper lever can lead to the activation of a rain-sensor menu or an interval menu on a display device. However, said menu does not need to be activated after identification of the intention to switch the windscreen wiper on or off.

It can therefore also be provided that, once the manner of the intended mechanical operation has been identified, the evaluation device can trigger an operating function which is different from an operating function associated with said manner of intended mechanical operation. As has already been mentioned above, this can be the activation of the blind-spot monitoring device when an intended activation of an indicator is detected in advance. Thus, certain driver assistance systems can be activated even earlier and the safety of the vehicle passengers can be further increased.

It is particularly preferable for the sensor arrangement to have at least two said touch-sensitive and/or proximity-sensitive sensor elements which are arranged on the actuation lever, in particular at an angle to one another. The evaluation device can then be configured to identify the operating gesture on the basis of a combination of at least two detected (simultaneous or temporally offset) touches of different sensor elements and/or approaches towards different sensor elements. Therefore, in this embodiment, the at least two touches and/or approaches relate to different sensor elements, with the result that the operating gesture is determined on the basis of a combination of (simultaneous or temporally offset) touches on at least two sensor elements and/or approaches towards at least two sensor elements. As a result of this, the operating gesture can be identified in a more precise manner.

In this case, the evaluation device can detect the—substantially—simultaneous touch of a predetermined combination of individual sensor elements and/or the simultaneous approach towards said combination of the sensor elements and, on the basis of said detection, identify the operating gesture. Hence, the static combination of the sensor elements which are actuated by the user is identified here. Therefore, a multiplicity of widely varying functions can be triggered with only a few sensor elements and with one and the same actuation lever. By way of example, a combination is present when an approach or touch on a low group or lower set of the sensor elements is detected at an instant or within a predefined time interval. A plausibility check can be performed here in the way that said combination is to be identified for a defined period depending on the situation.

In addition or as an alternative, the evaluation device can also be configured to detect a temporal sequence of touches on the individual sensor elements and/or approaches towards the individual sensor elements and to identify the operating gesture on the basis of the sequence. Here, a certain dynamic movement sequence on the sensor electrodes is identified. Thus, the area of application and the functionality of the operating device are further expanded. In this embodiment, it is therefore made possible to identify certain movement sequences which are known to the evaluation device. The evaluation device can associate said movement sequences with an expected actuation desire of the actuation lever and, as a result, can evoke the desired reaction. A movement sequence is present, for example, when a temporally offset activation of two or more sensor elements and a subsequent deactivation are identified. Thus, a movement sequence is present, for example, when the activation of a first sensor element at a first instant and of a second sensor element at a subsequent second instant is identified and, at the second instant, the first sensor element is identified as being deactivated again. The second instant can also be understood here to mean a short time interval around said instant. Following this, a third sensor element is identified as being activated at a third instant, and in a short time interval around the third instant the second sensor element is identified as being deactivated again and so on and so forth. Correspondingly, however, a movement sequence may also appear as at least two different sensor elements being activated at a first instant and at least two other sensor elements being activated at a subsequent second instant.

The area of application or the functionality of the operating device can also be expanded in that the evaluation device can detect a duration of the touch and/or the proximity and can identify the operating gesture on the basis of the duration or can trigger a predetermined function. It is also possible for the evaluation device to detect the duration between two consecutive touches and/or approaches and, on the basis of the duration of said touch-free moment, to trigger a predetermined function. A predetermined function can then be triggered, for example, when the user touches the actuation lever for three seconds and then, after, for example, two seconds have elapsed, touches the actuation lever once again at the same point or another point for three seconds.

It is particularly preferable when a multiplicity of said touch-sensitive and/or proximity-sensitive sensor elements are provided and are arranged so as to be distributed annularly in the circumferential direction of the actuation lever. The functionality or the area of application of the operating device is then further expanded by means of a specific arrangement of the sensor elements, namely by means of an annular arrangement of the sensor elements, which are arranged so as to be spaced apart from one another, around the steering column stalk in the circumferential direction. Thus, a new manner of operation is made possible, in which the user—namely in particular the driver—can perform a rotational movement of at least one finger over the sensor elements around the actuation lever in the circumferential direction and hence trigger a wide variety of functions in the motor vehicle or effect a wide variety of processes. By a stroking action such as this of the actuation lever in the circumferential direction thereof, predetermined functions can be triggered, for example, the present value of a parameter can be increased or decreased, in particular depending on in which direction the sliding movement is made around the actuation lever. If the actuation lever is a steering column stalk, multifunctionality of the steering column stalk is made possible, with the result that the driver can trigger a multiplicity of widely varying functions with one and the same steering column stalk without his attention being diverted from the road. In this case, for example, it can be provided that a headlight of the motor vehicle and/or a windscreen wiper and/or an interior illumination and/or an interior heating and/or a window heating and/or a seat heating and/or a seat adjustment and/or an indicator of the motor vehicle are/is controllable by means of the sensor elements.

Therefore, the sensor elements can be arranged on an outer circumference of the actuation lever. The sensor elements are preferably arranged so as to be equally spaced apart in the circumferential direction of the actuation lever. Thus, the sensor elements together form a symmetrical ring on which a wide variety of operating actions can be performed.

The evaluation device can be configured to detect a rotational movement of at least one finger of the user over the sensor elements around the actuation lever in the circumferential direction and to trigger a predetermined function owing to said rotational movement. This manner of operation is particularly user-friendly; the user only needs to perform a circular sliding movement with one or more fingers on the outer circumference of the actuation lever in the circumferential direction thereof and the function is triggered immediately. By way of example, the present value of a parameter can be changed owing to the rotational movement, said parameter being, in particular, a volume of a music system of the motor vehicle and/or a brightness of an illuminant, namely of an interior illumination, for example. The change in the parameter value is therefore also possible without using operating elements that are liable to wear.

One embodiment provides that the operating device is a capacitive operating device and the sensor elements are designed as capacitive sensor electrodes which in each case form a part of an actuation capacitor, the capacitance of which is variable by touch and/or approach. The evaluation device can be configured to detect the change in the capacitances of the respective actuation capacitors and, as a result of this, to detect the touch and/or the approach. The capacitive route makes it possible to identify the touch on and/or approach towards the sensor elements in a particularly reliable manner. The capacitive operating device also has a particularly good sensitivity, with the result that every touch or approach can be identified.

Preferably, the at least one sensor element is covered by a structure element formed on an outer circumference of the actuation lever, namely in particular an indentation or alternatively a projection. Said structure element is then arranged in radial overlap with the associated sensor element. The structure element can also consist of a differently configured surface which can meaningfully be felt out by fingers, such as rippling, grain or the like. By way of example, it can also be provided that the operating device has a cover element by means of which the at least one sensor element is covered and on the outer circumference of which the structure element is formed. The cover element can be provided, for example, in the form of a sleeve or a ring which is fitted on a main body of the actuation lever. However, in principle, no cover element is necessary and the sensor elements can also, for example, be injection-moulded into a housing or accommodated with a flexible printed circuit board in the housing or elsewhere in the actuation lever. The use of a structure element has the advantage that the touch points of the sensor elements are fixedly predefined by the structure elements, with the result that the driver or the user can feel out the fixedly predefined touch points with his hand without having to look at the actuation lever.

In one embodiment, the at least one sensor element is arranged on an operating element of the actuation lever, which operating element is moveable relative to a main body of the actuation lever, in particular is rotatable about a longitudinal axis of the elongate actuation element. In this way, multifunctionality of the operating device in respect of different manners of operation is made possible. In particular, the operating element can be mechanically actuated and, moreover, a function can also be triggered solely by the touch and/or approach. This embodiment also makes it possible for the intention of the driver to mechanically actuate the operating element to possibly be identified by means of the evaluation device. On the basis of the approach and/or touch, the evaluation device can predict, namely in advance, that the driver will probably mechanically actuate the actuation lever.

The evaluation device can also be configured to output, on the basis of the touch on the sensor arrangement and/or on the approach towards the sensor arrangement,—that is to say depending on the identified operating gesture—a control signal to an optical display device—for example a display—of the motor vehicle, as a result of which control signal a menu having a multiplicity of displayed selectable menu entries is displayed on the display device. A menu such as this can be displayed, for example, after a double touch on the actuation lever has been identified, that is to say after the actuation lever is touched twice in quick succession. The driver therefore does not have to expend effort searching for a special button for activating the menu, he can merely touch the actuation lever—for example, the steering column stalk—(twice) and the menu is displayed immediately.

If the menu is displayed on the display device, one of the displayed menu entries can be selected by means of the sensor elements and, in this connection, can be optically highlighted on the display device with respect to other menu entries. By way of example, one of the menu entries can be selected by means of a rotational movement of at least one finger over the sensor elements around the actuation lever in the circumferential direction thereof. Thus, with one and the same actuation lever, the user can both activate the menu and select one of the displayed menu entries.

It proves to be particularly advantageous when the selection of the selected menu entry can also be confirmed by means of the sensor elements. Provision can also be made here for the selected menu entry to be confirmed by means of a "double-click", that is to say by means of the actuation lever being touched twice in quick succession. The entire menu navigation therefore takes place with the aid of the actuation lever. This is a possible sequence:

by means of a double touch, a menu is displayed on the display device—for example in the combination instrument—said menu having influenceable functions or having a multiplicity of menu entries;

the driver now selects the desired function or the desired menu entry, namely the brightness of a searchlight, for example, by a rotational movement or sliding movement on the outer circumference of the actuation lever;

the driver then confirms the selection of the function by a double touch on the actuation lever;

the driver can now adjust the desired brightness value by a further rotational movement on the actuation lever; and the driver finally confirms his adjustment by another double touch on the actuation lever.

The evaluation device can also be capable of learning: if the actuation lever is mechanically actuable in at least two manners then the evaluation device can be configured to store an item of information relating to the manner of the mechanical actuation associated with an item of information relating to the touch and/or approach—which, in particular, has just occurred—in a memory device when the actuation lever is mechanically actuated. Said items of information can then be taken into account in the event of a later operation. The adaptive evaluation device can therefore be adapted to the operation behaviour of the driver and identifies which action of the driver usually follows a particular manner of touch on the sensor elements. For example, if the driver always touches a particular combination of two or three sensor elements before a push movement of the actuation lever, the history can be taken into account as additional information in the event of a uniquely similar but not unambiguously identified touch or sensor constellation. This means that the stored items of information can be taken into account, for example, if the evaluation device cannot unambiguously identify the touch and/or approach. Thus, the plausibility check can be performed on the identification of the touch and/or approach and the reliability can be increased.

The evaluation device can also take driving situations into account: for example, the touch and/or approach can trigger different reactions during driving than during standstill of the motor vehicle. That is to say, the evaluation device can detect a driving parameter—the driving situation—and trigger a predetermined function on the basis of said driving parameter and on the basis of the touch and/or approach. In this connection, it is possible to differentiate between the following driving situations: braking and/or accelerating and/or driving around a corner and/or the presence of an object in the blind spot.

The evaluation device can also be configured to output a feedback signal once a touch and/or approach has been identified, by means of which feedback signal the touch and/or approach is confirmed to the driver. A cognitive or discernible item of feedback such as this can be realized by means of a beep and/or a vibration of the actuation lever, for example.

The touch-sensitive sensor elements can also be used as redundancies for mechanical switches. More precisely, on the basis of the touch and/or approach, a plausibility check for the mechanical actuation of the actuation lever can be performed.

All in all, an operating device is therefore provided which enables the activation or deactivation of almost any functions in the motor vehicle and the triggering of a wide variety of functions. By way of example, a first reaction can be the appearance of a menu in a display which informs about associated and adjustable functions. A second function can be, for example, the activation or deactivation of a rain sensor or the switching on or off of a boot illumination. A further reaction can be the adjustment of a nominal value of a vehicle function, for instance the brightness of the interior illumination.

A motor vehicle according to the invention has an operating device according to the invention. The preferred embodiments and the advantages thereof presented with respect to the operating device according to the invention correspondingly apply to the motor vehicle according to the invention.

Further features of the invention emerge from the claims, the figures and the description of the figures. All of the features and combinations of features mentioned above in the description and the features and combinations of features mentioned below in the description of the figures and/or only shown in the figures are applicable not only in the respectively specified combinations but also in other combinations or else on their own.

The invention will now be explained in more detail on the basis of a preferred exemplary embodiment and also with reference to the appended drawings, in which.

Figure 1:
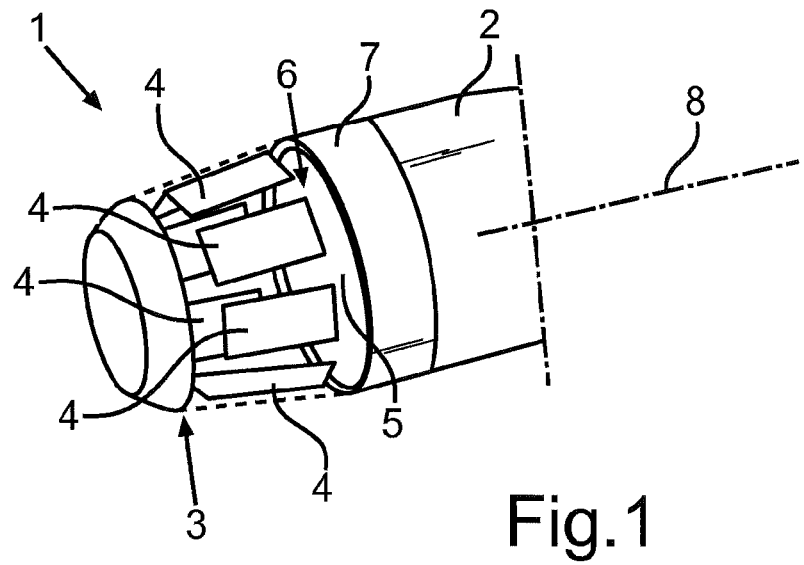
FIG. 1 shows a schematic and perspective illustration of an operating device according to an embodiment of the invention.

FIG. 1 illustrates an operating device 1, and more precisely merely subcomponents of the operating device 1, in a schematic illustration. The operating device 1 contains an actuation lever 2 which is designed in the exemplary embodiment as a steering column stalk of a steering column switch of a passenger vehicle. A multiplicity of sensor elements 4 are arranged in an end region 3 of the actuation lever 2, which sensor elements are capacitive sensor electrodes in the exemplary embodiment and together form a sensor arrangement. The sensor elements 4 are in each case in the form of a thin plate composed of an electrically conductive material—for example, from copper—and are in the shape of an elongate rectangle. The sensor elements 4 can also be embodied as electrically conductive film.

The actuation lever 2 is an elongate element having a cylindrical cross section, wherein only the end region of the actuation lever 2 is illustrated in the figures for the sake of clarity. The sensor elements 4 are arranged on an outer circumference 5 of the actuation lever 2 so as to be distributed annularly in the circumferential direction, with the result that they form an annular structure around the actuation lever 2. In this connection, the sensor elements 4 are arranged so as to be distributed in a manner spaced apart at equal distance from one another, with the result that the spacing between the respective adjacent sensor elements 4 in the circumferential direction are identical. The individual sensor elements 4 also have an elongate configuration and extend in the longitudinal direction of the actuation lever 2.

In the exemplary embodiment, the sensor elements 4 are mounted on an end piece 6 which is designed to taper in the direction of the free end of the actuation lever 2. The diameter of the end piece 6 thus decreases steadily—and preferably also linearly—in the direction of the free end of the actuation lever 2. The end piece 6 can also form a mechanically actuable operating element which is moveable with respect to a main body 7 of the actuation lever 2, in particular is rotatable about the longitudinal axis 8 of the actuation lever 2. Alternatively, the end piece 6 can be an element which is fixed in position with respect to the main body 7.

In total, the number of sensor elements 4 used can be, for example, in a range of from 1 to 10. By way of example, three or four or five or six or seven or eight or nine sensor elements 4 can be used.

The actuation lever 2 can also be pivoted—in a manner known per se for steering column switches—in a horizontal or vertical direction relative to a steering column of the motor vehicle. Owing to said pivoting movement, different functions can be triggered in the motor vehicle, for instance activation of an indicator, activation of main beam, activation of a windscreen wiper, and the like. Further mechanical operating elements can also be mounted on the actuation lever 2, for instance push buttons and/or rotary knobs and/or toggle switches and the like. Provision can also be made for the actuation lever 2 to be able to be pushed in the direction towards the steering column and/or pulled in the direction away from the steering column. Thus, various functions can also be activated or deactivated. As an alternative, however, provision can also be made for the actuation lever 2 not to be mechanically actuable and not to have any mechanical switches, with the result that all operating functions can be triggered by means of the sensor elements 4.

Figure 2:
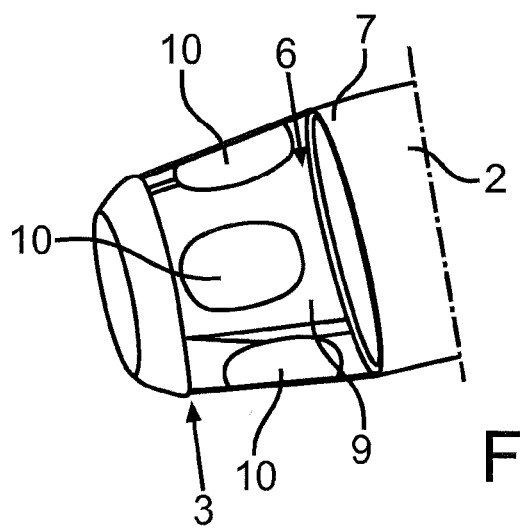
FIG. 2 shows a schematic and perspective illustration of the operating device according to FIG. 1, wherein sensor elements are covered with a cover element.
Figure 3:
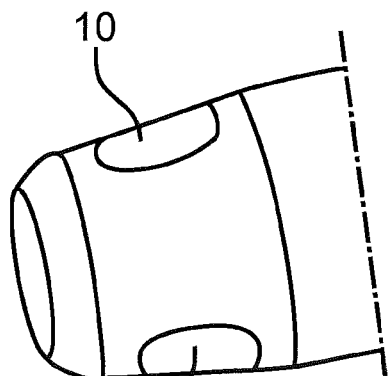
FIG. 3 shows a schematic and perspective illustration of the operating device with another cover element.

As is illustrated in FIGS. 2 and 3, the sensor elements can be covered by means of a cover element 9 on the outer circumference of which structure elements 10 can be formed. By way of example, one structure element 10 is associated with each sensor element 4, which structure element is arranged overlapping with the respective sensor element 4. However, provision can also be made for only in each case one structure element 10 to be associated with a certain subset of the sensor elements 4—as illustrated by way of example in FIG. 3. The structure elements 10 can be designed as indentations or else as projections by means of which the position of the sensor elements 4 is indicated. Therefore, the touch points are predefined by the structure element 10 formed on the outer circumference of the cover element 1. The driver can thus feel out the touch points without much effort and in this process does not need to look at the actuation lever 2. The cover element 9 is merely optional, however. Provision can also be made for the sensor elements 4 to be injection-moulded into a housing of the actuation lever 2, for example.

The sensor elements 4 are electrically coupled to an evaluation device—not shown in more detail in the figures—which detects the change in the capacitance of the respective actuation capacitors owing to a touch on and/or approach towards the sensor elements 4. By way of example, the electronic evaluation device can also be integrated in the actuation lever 2 or else arranged in a steering column switch or in another control device in the region of said steering column switch. By detecting the change in capacitance, the evaluation device can detect the individual sensor elements 4 being touched (obviously over the cover element 9) and/or the individual sensor elements 4 being approached. In the exemplary embodiment, the evaluation device can detect various manners of operation.

Firstly, the evaluation device can detect a circular sliding movement of one or more fingers around the end piece 6 in the circumferential direction. In other words, the evaluation device can identify a temporal profile of the actuation of the sensor elements 4 and trigger a predetermined function in the motor vehicle on the basis of said profile. A circular sliding movement of the finger around the end piece 6 can lead, for example, to the present nominal value of an operating parameter of the motor vehicle being changed.

By such a manner of operation, for example, the volume and/or the brightness of an illuminant can be adjusted.

In addition or as an alternative, the evaluation device can also detect a sequence of touches on the individual sensor elements 4 or approaches towards the individual sensor elements 4 and trigger a predetermined function in the motor vehicle on the basis of the detected sequence. This manner of operation can be used, for example, to activate or else to deactivate a wide variety of functionalities in the motor vehicle. By way of example, a rain sensor can be activated or deactivated by touching every second sensor element 4.

Touching one of the sensor elements 4 can also lead to a menu being displayed on a display of the motor vehicle. In order to display the menu, the driver can, for example, touch one of the sensor elements 4 twice in quick succession, with the result that the menu appears immediately after such a "double-click". Said menu can have a multiplicity of selectable menu entries which can be selected separately from one another. In order to select one of the displayed menu entries, the driver can perform the sliding rotational movement around the end piece 6, with the result that the menu entries are optically highlighted one after the other during said sweep over the outer circumference 5. Once one of the menu entries has been selected, said selection can also be confirmed with a "double-click" on the outer circumference 5.

Other manners of operation can be:
the evaluation device can also detect a duration of the touch and/or the approach and trigger a predetermined function on the basis of said duration;
the evaluation device can also detect a predetermined combination of individual sensor elements 4 being touched and/or said combination of sensor elements 4 being approached and trigger a predetermined function on the basis of the combination.

In very general terms, the evaluation device is therefore set up such that it can identify an operating gesture of the operator on the actuation lever 2, that is to say the manner in which the driver grasps the actuation lever 2, on the basis of the identified touch on the sensor elements 4 and/or the approach towards said sensor elements 4.

As has already been mentioned, the actuation lever 2 can also have mechanical operating elements, for example the end piece 6 which is rotatable about the longitudinal axis. Even the actuation lever 2 itself can be pivoted about the vehicle longitudinal axis and about the vehicle yaw axis in order to activate different functions. In general terms, the actuation lever 2 can be mechanically actuated in at least two manners. In this case, the evaluation device can predict the manner of the forthcoming actuation of the actuation lever 2 in advance on the basis of the identified operating gesture. This means that the evaluation device can determine the expected manner of mechanical actuation on the basis of the touch and/or approach, even before the driver has performed said mechanical actuation. The approach towards the lower sensor elements 4 or those that face the floor usually means, for example, that the actuation lever 2 will be pivoted upwards in the vertical direction. This item of information can be used, for example, to perform a plausibility check on the switch signals of the mechanical switches and hence on the detection of the mechanical actuation. On the basis of the identified intention of the driver, at least one driver assistance system can also be activated. Thus, for example, the identification of an intended actuation of an indicator can activate a blind-spot monitoring device by means of which the driver is warned of objects located in the blind spot. However, said blind-spot monitoring device does not need to be activated after identification of an intended activation of the main beam/headlight flasher. It is also possible to activate a rain-sensor menu or an interval menu on a display after the intention to change the sensitivity of a rain sensor or else an interval speed of a windscreen wiper has been identified. However, said menu does not need to be activated after the identification of the intention to switch the windscreen wiper on or off.

If the actuation lever 2 is mechanically actuable in at least two manners, the evaluation device can also store information relating to the manner of the mechanical actuation associated with an item of information relating to the touch and/or approach in a memory device when the actuation lever 2 is mechanically actuated. The evaluation device therefore learns which sensor elements 4 are touched in the event of which manner of mechanical actuation. The evaluation device can therefore identify which mechanical operation by the driver usually follows a particular manner of touch on the touch-sensitive sensor elements 4. Said stored in formation can be used to perform a plausibility check on a later touch and/or approach. If, for example, the driver always actuates a certain sensor element 4 before he pushes the actuation lever 2 along the longitudinal axis 8 thereof, then, in the event of a later touch which is similar but not unambiguously identified, the stored information can be taken into account and a plausibility check can be performed on the identified touch.

What is claimed is:

1. A touch-sensitive operating device for a motor vehicle, comprising:
an actuation lever that is a steering column stalk having an elongate configuration;
a sensor arrangement comprising at least one touch-sensitive and/or proximity-sensitive sensor element which is arranged on the actuation lever; and
an electronic evaluation device which is coupled to the at least one sensor element and is configured to detect the at least one sensor element being touched and/or the at least one sensor element being approached,
wherein the evaluation device is configured to identify an operating gesture of an operator on the actuation lever on the basis of a combination of at least two detected touches on the sensor arrangement and/or approaches towards the sensor arrangement, and to trigger a predetermined operating function on the basis of the identified operating gesture, and wherein the sensor arrangement has a multiplicity of touch-sensitive and/or proximity-sensitive sensor elements which are arranged so as to be distributed annularly in the circumferential direction of the actuation lever.

2. The operating device according to claim 1, wherein the actuation lever is mechanically actuable in at least two manners and the evaluation device is configured to determine in advance, on the basis of the detected operating gesture, the manner of an intended mechanical operation of the actuation lever.

3. The operating device according to claim 2, wherein the evaluation device is configured, once the manner of the intended mechanical operation has been identified, to trigger an operating function which is different from an operating function associated with said manner of mechanical operation, to activate a driver assistance system and/or a predetermined display on a display device.

4. The operating device according to claim 1, wherein the sensor arrangement has at least two touch-sensitive and/or proximity-sensitive sensor elements which are arranged on the actuation lever, at an angle to one another, wherein the evaluation device is configured to identify the operating gesture on the basis of a combination of at least two detected touches of different sensor elements and/or approaches towards different sensor elements.

5. The operating device according to claim 4, wherein the evaluation device is configured to detect a predetermined combination of individual sensor elements being touched at the same time and/or said predetermined combination of the sensor elements being approached at the same time and to identify the operating gesture on the basis of this.

6. The operating device according to claim 4, wherein the evaluation device is configured to detect a temporal sequence of touches on the individual sensor elements and/or approaches towards the individual sensor elements and to identify the operating gesture on the basis of the sequence.

7. The operating device according to claim 1, wherein the evaluation device is configured to detect a duration of the touch and/or the proximity and to identify the operating gesture on the basis of the duration.

8. The operating device according to claim 1, wherein the evaluation device is configured to identify a rotational movement of at least one finger of the user over the sensor elements around the actuation lever in the circumferential direction and to trigger a predetermined function owing to said rotational movement.

9. The operating device according to claim 8, wherein the evaluation device is configured to change the present value of a parameter owing to the rotational movement, said parameter being selected from the group consisting of a volume of a music system and a brightness of an illuminant.

10. The operating device according to claim 1, wherein the operating device is a capacitive operating device and the at least one sensor element is designed as a capacitive sensor electrode which forms a part of an actuation capacitor the capacitance of which is variable by touch and/or approach, wherein the evaluation device is configured to detect the change in the capacitance of the actuation capacitor and, as a result of this, to identify the touch and/or approach.

11. The operating device according to claim 1, wherein the at least one sensor element is arranged on an operating element of the actuation lever, which operating element is moveable relative to a main body of the actuation lever and is rotatable about a longitudinal axis of the elongate actuation lever.

12. The operating device according to claim 1, wherein the evaluation device is configured to output, on the basis of the identified operating gesture, a control signal to an optical display device, as a result of which control signal a menu with a multiplicity of selectable menu entries can be displayed on the display device.

13. The operating device according to claim 12, wherein the at least one sensor element having a rotational movement of at least one finger over the sensor elements around the actuation lever in the circumferential direction thereof, by which one of the displayed menu entries is selectable and, in this connection, is optically highlightable on the display device.

14. The operating device according to claim 12, wherein the selection of a selected menu entry can be confirmed by means of the sensor arrangement.

15. The operating device according to claim 1, wherein the actuation lever is mechanically operable in at least two manners and the evaluation device is configured to store an item of information relating to the manner of the mechanical operation associated with an item of information relating to the identified operating gesture in a memory device when the actuation lever is mechanically actuated.

16. A motor vehicle having an operating device according to claim 1.

* * * * *